US012627129B1

(12) United States Patent
Rierson

(10) Patent No.: US 12,627,129 B1
(45) Date of Patent: May 12, 2026

(54) COVER FOR ADDRESSABLE INPUT MODULE BOXES FOR BUILDING MONITORING SYSTEMS

(71) Applicant: Carter Rierson, Waunakee, WI (US)

(72) Inventor: Carter Rierson, Waunakee, WI (US)

( * ) Notice: Subject to any disclaimer, the term of this patent is extended or adjusted under 35 U.S.C. 154(b) by 848 days.

(21) Appl. No.: 17/854,912

(22) Filed: Jun. 30, 2022

Related U.S. Application Data

(60) Provisional application No. 63/223,591, filed on Jul. 20, 2021.

(51) Int. Cl.
| | |
|---|---|
| *H02G 3/08* | (2006.01) |
| *H02G 3/14* | (2006.01) |
| *H05K 5/02* | (2006.01) |
| *H05K 5/03* | (2006.01) |
| *G01D 11/24* | (2006.01) |

(52) U.S. Cl.
CPC .............. *H02G 3/081* (2013.01); *H02G 3/14* (2013.01); *H05K 5/0217* (2013.01); *H05K 5/03* (2013.01); *G01D 11/245* (2013.01)

(58) Field of Classification Search
CPC ............ H02G 3/10; H02G 3/14; H02G 3/086; H02G 3/08; H02G 3/081; H05K 5/0221; H05K 5/03; H05K 5/10; H05K 7/1427
See application file for complete search history.

(56) References Cited

U.S. PATENT DOCUMENTS

| | | | | | |
|---|---|---|---|---|---|
| 6,032,867 | A | * | 3/2000 | Dushane ............ | G05D 23/1904 |
| | | | | | 236/51 |
| 2005/0200495 | A1 | * | 9/2005 | Sibalich .............. | F21V 23/0442 |
| | | | | | 340/567 |
| 2014/0268800 | A1 | * | 9/2014 | Castillo ............... | F21V 23/0471 |
| | | | | | 362/373 |
| 2015/0340826 | A1 | * | 11/2015 | Chien ..................... | F21V 33/00 |
| | | | | | 439/490 |
| 2017/0344037 | A1 | * | 11/2017 | Novotny ................ | G05D 23/19 |

* cited by examiner

*Primary Examiner* — Steven T Sawyer
(74) *Attorney, Agent, or Firm* — Craig Fiescko; DeWitt LLP

(57) ABSTRACT

A module box cover for covering addressable input modules used in fire and other building monitoring systems has a pocket defined therein, with the pocket being configured to receive a sensor situated such that it may be readily wired to the module situated within the module box on which the cover is to be situated. Thus, a user may (for example) situate a low-temperature sensor in a cover's pocket, wire the sensor to a sprinkler control module, and install the cover on the module or its module box, thereby enclosing the module within the module box. The sensor will thereafter warn of low-temperature conditions that could freeze and damage the associated sprinkler system.

19 Claims, 8 Drawing Sheets

COVER FOR ADDRESSABLE INPUT MODULE BOXES FOR BUILDING MONITORING SYSTEMS

FIELD OF THE INVENTION

This document concerns an invention relating generally to building monitoring systems (e.g., fire, security, environmental, and other monitoring systems), and more specifically to covers for addressable input modules used in building monitoring systems.

BACKGROUND OF THE INVENTION

Building monitoring systems often receive inputs from fire, sprinkler, pump, and other systems via devices commonly known as "input modules," "addressable modules," or "addressable input modules" (but which may hereinafter be simply referred to as "modules"). Such modules may be situated about a building, and are electrically connected to sensors whereby the modules relay status information (e.g., the on/off status of a sprinkler system) to the building monitoring system. For example, a module might be wired to a paddle switch within the supply pipe of a sprinkler system; when water flows in the supply pipe (indicating that the sprinkler is on), the paddle deflects, closing the switch, with the module then relaying the switch status to the building monitoring system to indicate that the sprinkler is on. Modules are typically provided in such a form that they may be mounted within conventional wall-mounted electrical junction boxes, or are instead provided within their own stand-alone wall-mountable boxes ("alarm input boxes"). These boxes are generically referred to as "module boxes." As an example, FIG. 1a shows a module box 100 mounted to a wall 102, with the module box 100 containing a module 112 (FIG. 1b) which communicates with sprinkler valve switches 106 via lines 104.

Some building monitoring systems benefit from the use of temperature sensors; for example, sprinkler systems can benefit from the use of low-temperature thermostats where sprinklers are subject to freezing concerns (as freezing may cause pipe bursts and flooding, or may at least hinder the sprinkler system's effectiveness). When used, such temperature sensors are typically mounted on a wall, with wires extending to a module within a module box so the module can relay a signal to the building monitoring system when a temperature threshold of concern is crossed. These sensors are known to be time-consuming, inconvenient, and annoying to install: inefficiencies arise from locating suitable wall-mounting hardware (if not provided with the sensor); wall-mounting often requires the driving of screws or other fasteners into concrete or metal (which can be difficult); and the sensor and/or its wires may need to be covered for protection (as by situating a wall-mounted "cage" over the sensor, and installing the wires within electrical conduit), and/or for better aesthetic appearance. Similar problems arise where other sensors (e.g., smoke/particle, moisture/humidity, light, motion, or other sensors) are to be added to building monitoring systems.

SUMMARY OF THE INVENTION

The invention, which is defined by the claims set forth at the end of this document, is directed to a module box cover which at least partially alleviates the aforementioned problems. A basic understanding of some of the features of preferred versions of the module box cover can be attained from a review of the following brief summary of the invention, with more details being provided elsewhere in this document. To assist in the reader's understanding, the following review makes reference to the accompanying drawings (which are briefly reviewed in the "Brief Description of the Drawings" section following this Summary section of this document).

Referring to the exemplary module box cover 200 of FIGS. 2a-2b, the cover 200 includes a cover plate 202 having a front plate surface 204 (FIG. 2a) and an opposing rear plate surface 206 (FIG. 2b), and a sensor pocket 208. The sensor pocket 208 has pocket walls defining a pocket interior 210 configured to receive a sensor 20 (seen outside the pocket 208 in FIG. 2a, and installed within the pocket 208 in FIG. 2b). The pocket walls include a pocket sidewall 212 extending forwardly from the rear plate surface 206 to a pocket forewall 214 spaced forwardly from the front plate surface 204. Thus, a suitable sensor 20—here a 40° F. temperature sensor warning of potential impending freezing conditions in pipes for a sprinkler system monitored by addressable input module 22—can be quickly and easily wired to the module 22 and inserted within the pocket interior 210, with the cover plate 202 then being fastened to the module 22 (e.g., via fasteners inserted through fastener apertures 216 in the cover plate 202) to effectively mount the sensor 20 to the module 22. As the module 22 is (or can be) affixed within the module box 24, the cover plate 202 at the same time encloses the module 22 within the module box 24, protecting the module 22 as well as the sensor 20. At least one port 218 extends through the pocket walls (through the pocket forewall 214 in FIG. 2a), allowing the sensor 20 to more rapidly detect the ambient temperature (or other ambient environmental conditions where other types of sensors 20 are used). One or more lamp apertures 220 are also provided in the cover plate 202, with the lamp apertures 220 being situated in alignment with any lamp(s) 26 provided on the module 22 to which the cover plate 202 is configured to attach, such that signals emitted by the module's lamp(s) 26 are visible from/through the cover plate 202 when installed on the module 22. The cover plate 202 also preferably includes a rearwardly-extending lip 222 bounding the rear plate surface 206 to mask the edges/corners of the module 22, and to more fully enclose the module 22 within the module box 24.

A sensor enclosure 224 is preferably provided about the sensor pocket 208, with the sensor enclosure 224 having an enclosure wall 226 extending forwardly from the front plate surface 204 at locations spaced from the pocket sidewall 212, and converging at locations spaced from the front plate surface 204 to join the pocket sidewall 212 (with the sensor enclosure 224 of FIGS. 2a-2b having its enclosure wall 226 join the pocket sidewall 212 rearwardly from the pocket forewall 214, as seen in FIG. 2a). One or more ribs 228 (FIG. 2b) preferably extend from the pocket sidewall 212 to the enclosure wall 226. The enclosure wall 226 and ribs 228 help reinforce the sensor pocket 208 as it protrudes from the front plate surface 204, better protecting it from being sheared from the front plate surface 204 if struck.

As best seen in FIG. 2b, the exemplary module box cover 200 also includes one or more depressions 230 in its pocket sidewall 212 adjacent the rear plate surface 206, with each depression 230 extending outwardly from the pocket interior 210. Preferably, depressions 230 are provided at locations spaced about the interior circumference of the sensor pocket 208, most usefully being provided in pairs wherein depressions 230 are situated at opposite sides of the pocket. A user may therefore insert his/her fingers and/or tools (e.g., plier jaws) into these depressions 230 to more easily grasp a sensor 20 situated within the pocket interior 210 for removal or other manipulation. Each depression 230 is preferably situated within the sensor enclosure 224 such that it is bounded at least in part by the enclosure wall 226, with the depressions 230 of FIG. 2*b* being wholly bounded (and defined in part) by the enclosure walls 226.

The module box cover 200 therefore avoids, or at least reduces some of, the aforementioned problems. An installer may simply wire the sensor 20 to the module 22 within the module box 24, and install the module box cover 200 on the module 22 with the sensor 20 situated within the pocket 208. The sensor 20 is therefore secured within the module box cover 200 without the need for time-consuming and inconvenient external mounting, and without the need for extended external leads between the module box 24 and the sensor 20. The pocketed module box cover 200 can therefore save significant installation time and provide a more aesthetically pleasing appearance when a sensor 20 is to be installed, as well as providing greater protection for the sensor 20 and its associated wiring.

Further potential advantages, features, and objectives of the invention will be apparent from the remainder of this document in conjunction with the associated drawings.

DETAILED DESCRIPTION OF EXEMPLARY VERSIONS OF THE INVENTION

Figure 1A:
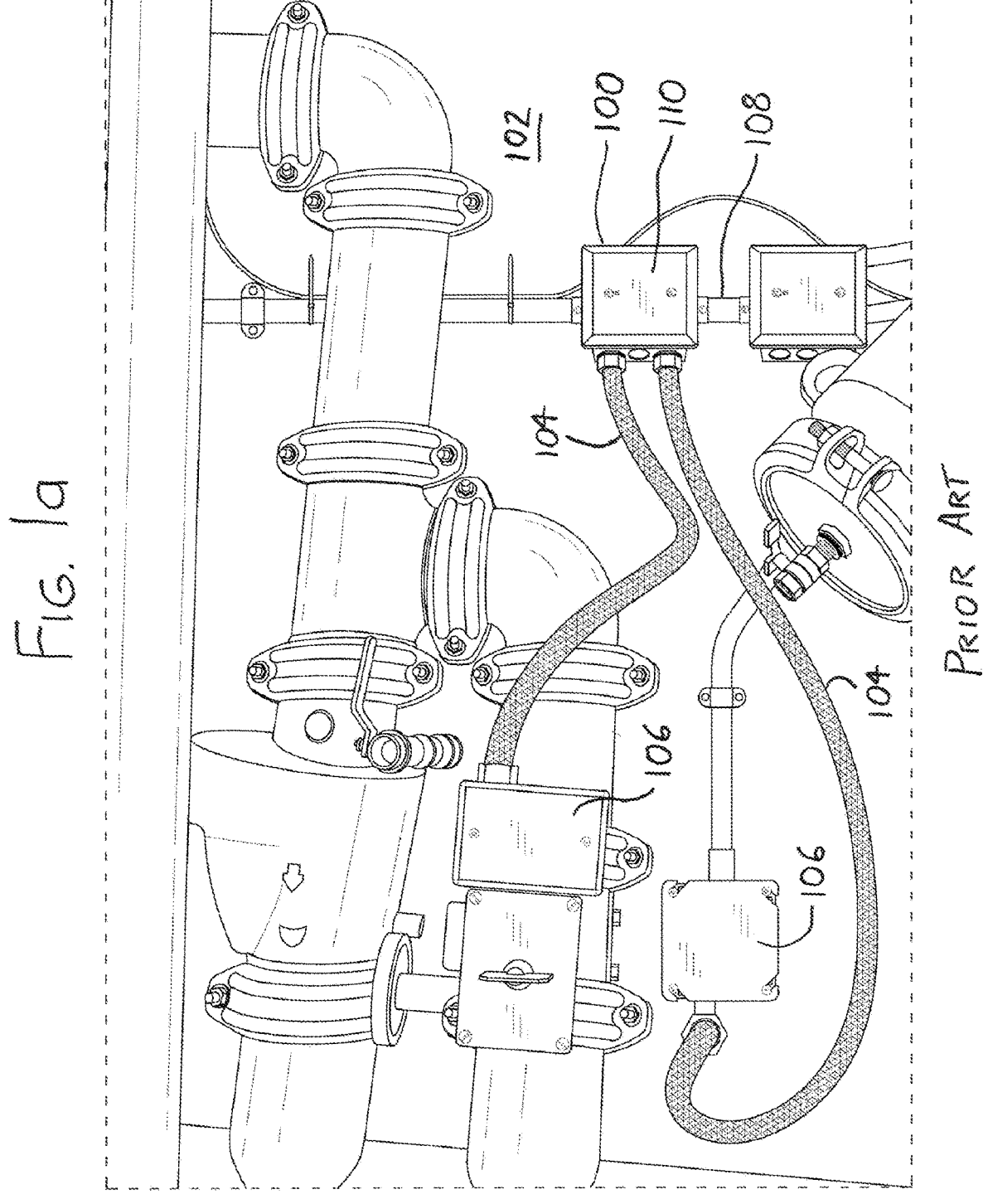
FIG. 1*a* is an image showing a conventional module box 100 mounted to a wall 102, with cable-bearing conduits 104 leading from the module box 100 to sprinkler switches (valves) 106 whose conditions are monitored by the modules (not shown) within the boxes 100, and with conduits 108 containing the signal line cables (not shown) whereby the module within box 100 communicates with a building monitoring system.
Figure 1B:
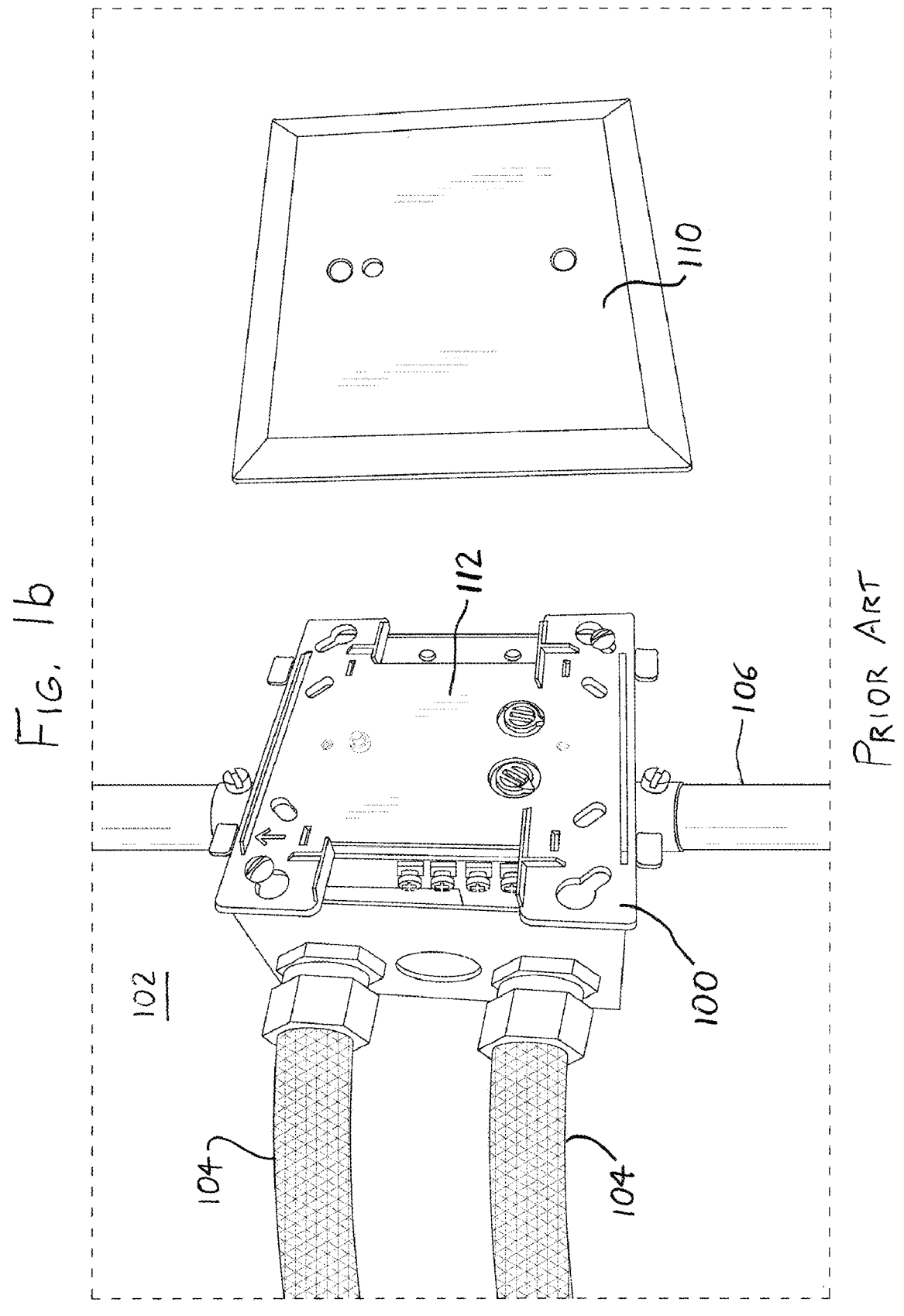
FIG. 1*b* is a closer view of one of the module box 100 of FIG. 1*a*, shown with its module box cover 110 removed to show the addressable input module 112 mounted therein.
Figure 2A:
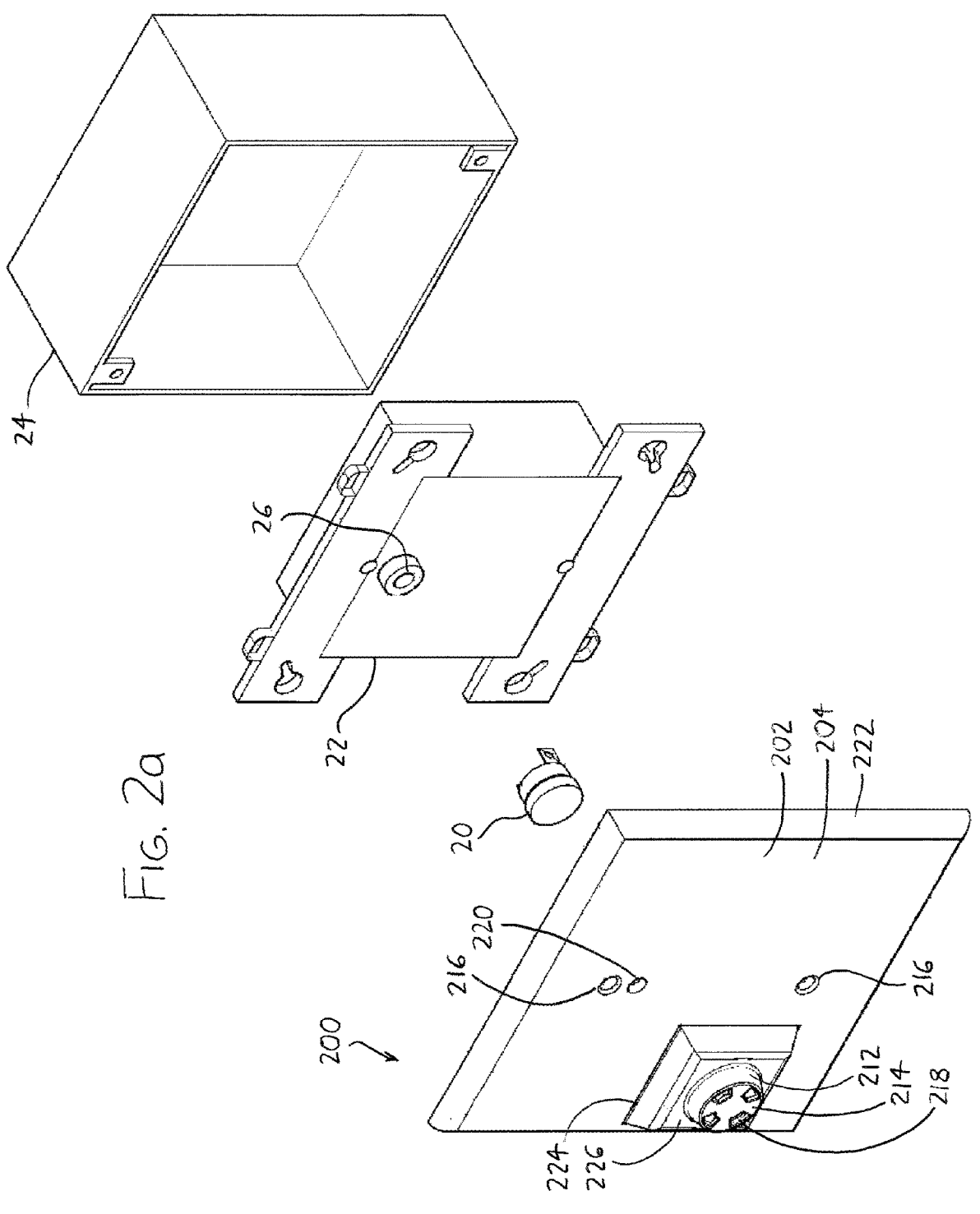
FIG. 2*a* is an exploded (disassembled) front isometric view of a module box 24 and Honeywell module 22 (Honeywell Building Technologies, Northford, CT) along with a first exemplary module box cover 200 exemplifying the invention, and a sensor 20 for connection to the module 22 (and installation within the cover 200).
Figure 2B:
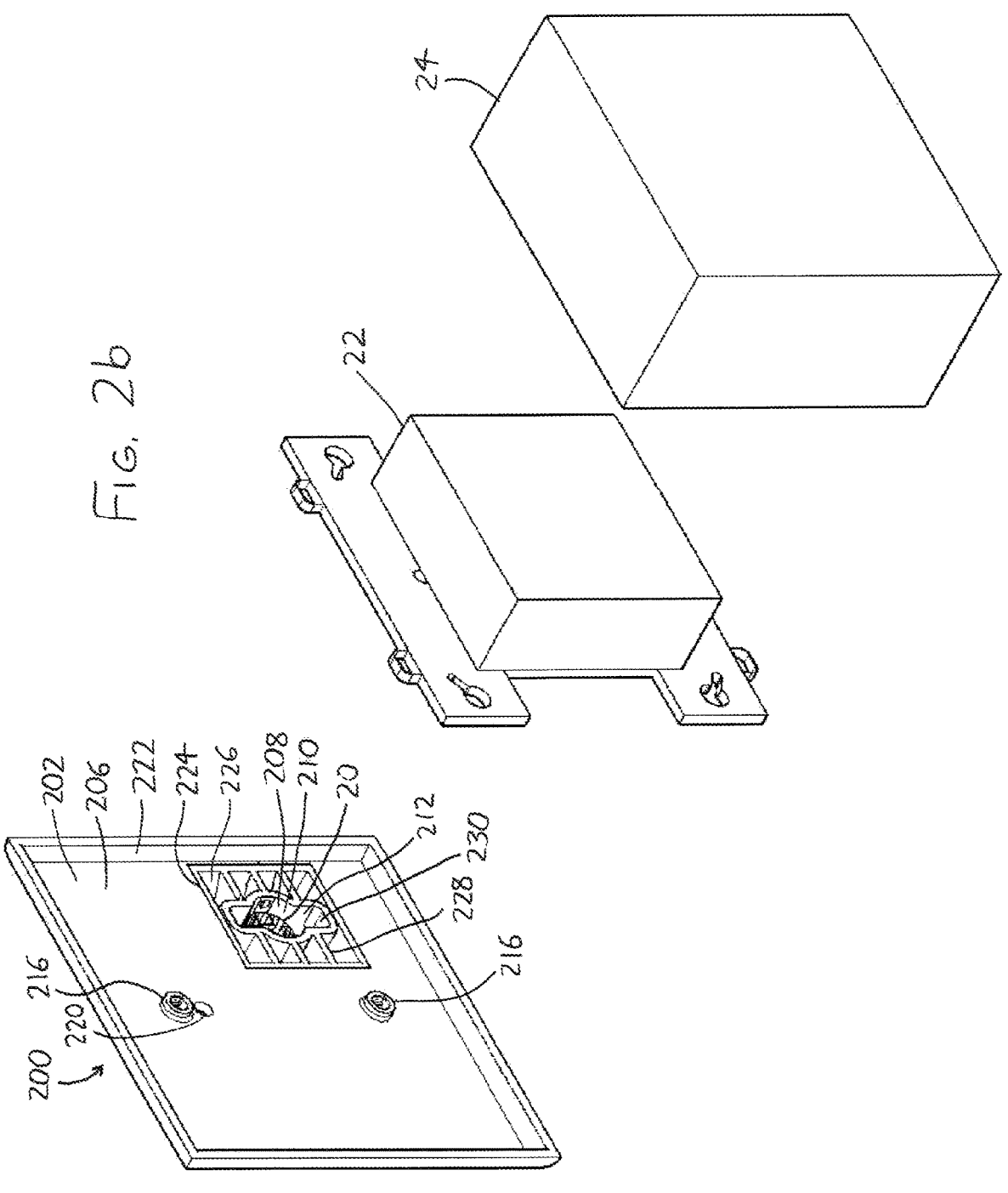
FIG. 2*b* is an exploded (disassembled) rear isometric view of the module box 24, module 22, sensor 20, and module box cover 200 of FIG. 2*a*, shown with the sensor 20 inserted within the pocket 208.

Expanding on the discussion above, the module box cover 200 of FIGS. 2*a*-2*b* is configured for use with Honeywell addressable input modules 22, which are designed for installation in conventional square utility boxes 24. The module box cover 200 may be used in place of any conventional module box cover provided with a module 22 (such as the cover 108 shown in FIGS. 1*a*-1*b*), and is installable and removable via fasteners in the same manner as the conventional module box cover 108, though alternative or additional means of affixing the module box cover 200 to the module 22 and/or the module box 24 might be provided (e.g., the lip 222 of FIG. 2*b* might be designed to closely fit about and engage the mouth of the module box 24).

Figure 3A:
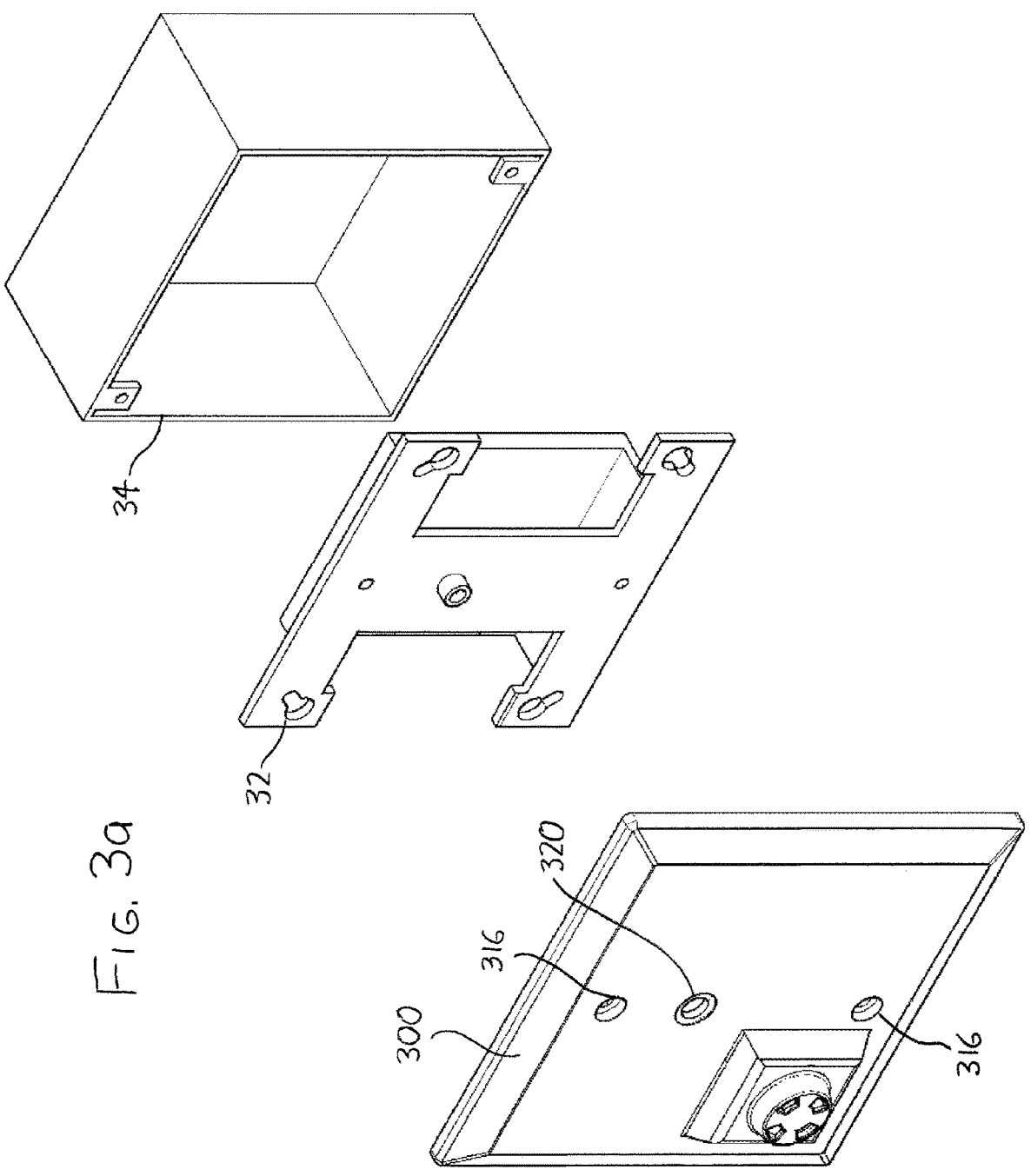
FIG. 3*a* is an exploded (disassembled) front isometric view of a Potter module 32 (Potter Electric Signal Company, St. Louis, MO) and module box 34 along with a second exemplary module box cover 300 exemplifying the invention.
Figure 3B:
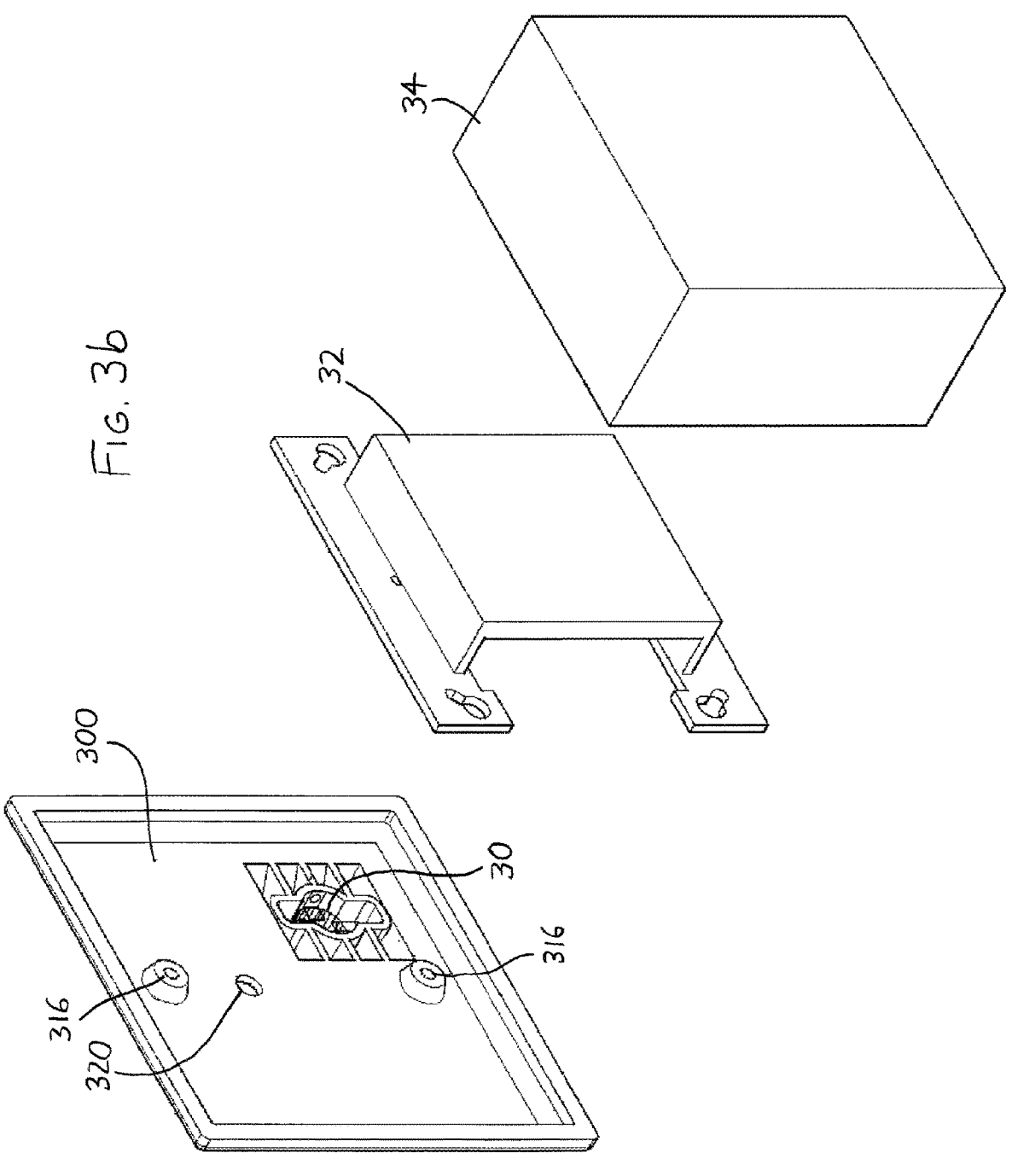
FIG. 3*b* is an exploded (disassembled) rear isometric view of the module 32, module box 34, and module box cover 300 of FIG. 3*a*, shown with a sensor 30 inserted within the pocket.
Figure 4A:
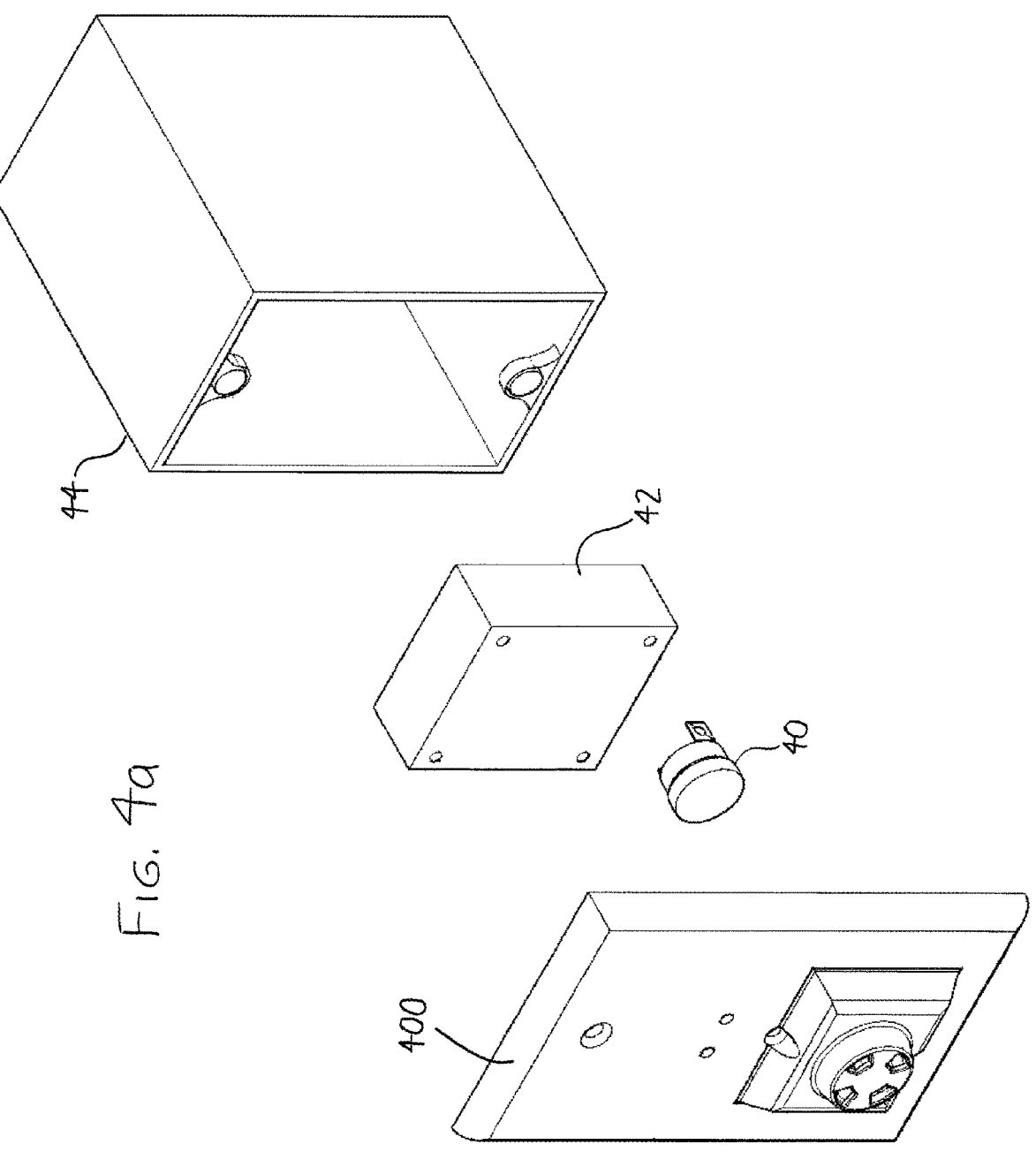
FIG. 4*a* is an exploded (disassembled) front isometric view of an Edwards module 42 (Edwards Safety, Bradenton, FL) and module box 44 along with a third exemplary module box cover 200 exemplifying the invention.
Figure 4B:
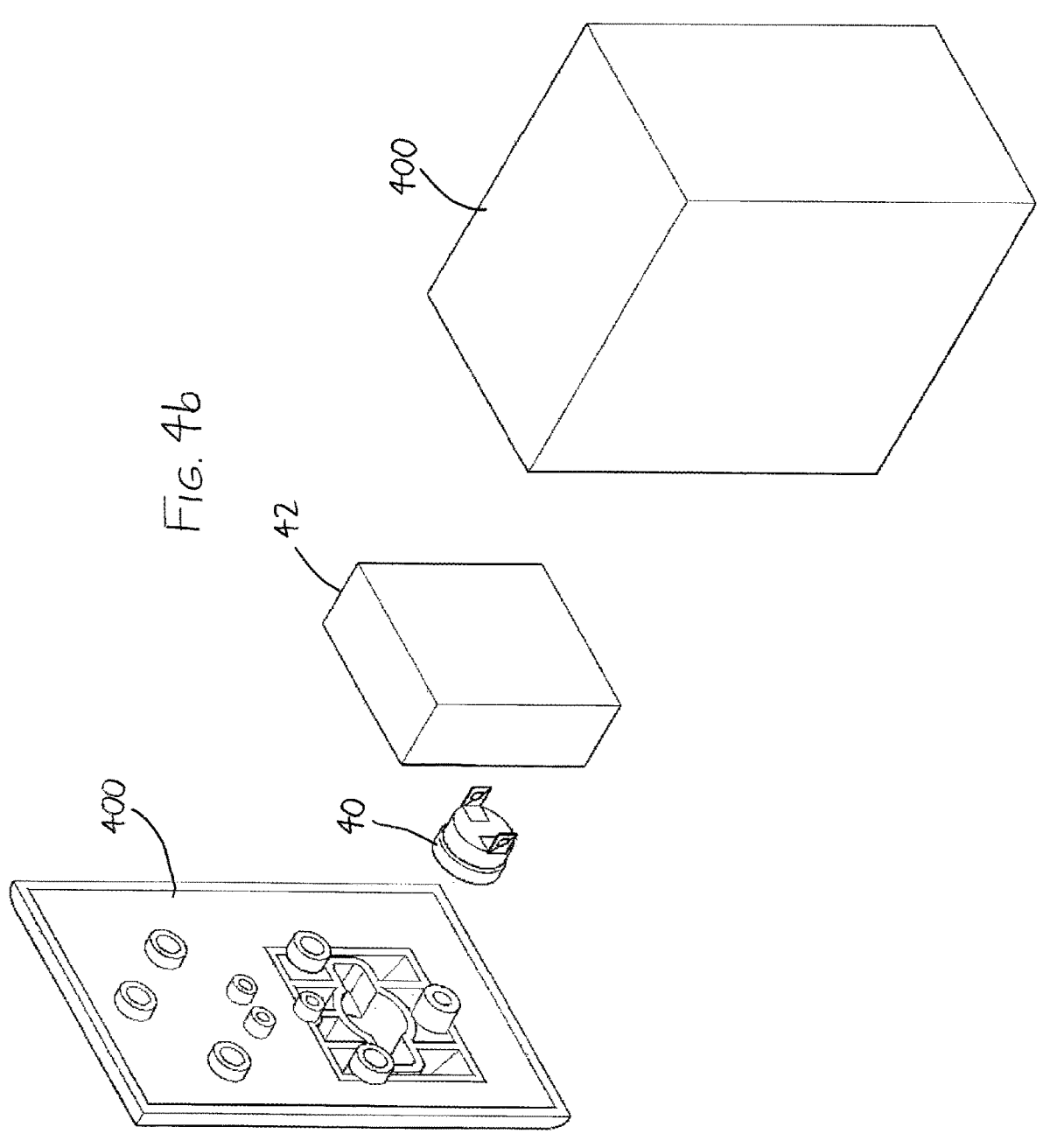
FIG. 4*b* is an exploded (disassembled) rear isometric view of the module 42, module box 44, and module box cover 400 of FIG. 4*a*, shown with a sensor 40 inserted within the pocket.

FIGS. 3*a*-3*b* illustrate an alternative module box cover 300 configured for use with Potter addressable input modules 32, which are also designed for installation in conventional square utility boxes. The depicted features of the cover 300, and the functions of these features, are generally analogous to those of the module box cover 200 of FIGS. 2*a*-2*b*, with minor differences in the placements of the fastener and lamp apertures 216/220 and 316/320 (as the fastener and lamp placements differ slightly between Honeywell and Potter modules 22 and 32). FIGS. 4*a*-4*b* then illustrate another exemplary module box cover 200 configured to mount on an Edwards module 22 and its associated module box 24, and to accommodate a sensor 20 for connection and communication with its module 22.

As should be evident from review of the various module box covers 200, 300, and 400, the configuration of the invention can be modified to accommodate a wide variety of different modules and module boxes, as well as a variety of different sensors via appropriate configuration of the sensor pocket. The module box cover may be manufactured in different sizes/configurations, each being configured to fit a particular combination of module, module box, and sensor. When installing a sensor, an installer may therefore simply select a pocketed module box cover suitable for installation on the module and module box in question (with the pocket also being suitably configured to receive the sensor in question), and rapidly install the sensor with minimal effort. In some cases, module box covers suitable for use with multiple module/module box/sensor combinations may be possible. For example, fastener and lamp apertures 216 and 220 might be provided such that the module box cover may be fit atop a Honeywell module 22 as in FIGS. 2*a*-2*b*, and 90° rotation of this module box cover would bring into alignment another set of fastener and lamp apertures 316 and 320 which allow the cover to be fit atop a Potter module 32 as in FIGS. 3*a*-3*b*. This module box cover might include multiple pockets (e.g., one in each corner/quadrant of the cover plate), with each configured to accommodate a different type and/or model of sensor.

The pocket of the module box cover need not accommodate only temperature sensors, and might receive other sensors instead (e.g., smoke/particle, moisture/humidity, light, motion, or other sensors). The sensor within the module box cover's pocket need not communicate with the module via wire, should the sensor and module be configured for wireless communication. Moreover, the module box cover may have more than one pocket to accommodate more than one sensor. The configuration of the module box cover may vary in numerous other respects as well. As examples, looking to the module box cover 200 of FIGS. 2*a*-2*b*, the pocket sidewall 212 might have a series of adjoining discrete surfaces, rather than a continuous surface (similar to the enclosure wall 226); likewise, the enclosure wall 226 might have a continuous surface (e.g., a dome-like surface) rather than the adjoining discrete surfaces shown; the enclosure wall 226 may extend to, and merge with, the pocket forewall 214; and/or the enclosure 224 might be omitted, with one or more ribs 228 then preferably extending from the cover plate 202 (e.g., from the cover plate front surface 204) to the pocket sidewall 212.

Various terms referring to orientation and position used throughout this document—e.g., "front" (as in "front plate surface") and "rear" (as in "rear plate surface")—are relative terms rather than absolute ones. In other words, it should be understood (for example) that the front plate surface being referred to may in fact be located at the rear of the module box cover depending on the overall orientation of the cover. Thus, such terms should be regarded as words of convenience, rather than limiting terms.

The versions of the invention described above are merely exemplary, and the invention is not limited to these versions. Rather, the scope of rights to the invention is limited only by the claims set out below, and the invention encompasses all different versions that fall literally or equivalently within the scope of these claims. In these claims, no element therein should be interpreted as a "means-plus-function" element or a "step-plus-function" element pursuant to 35 U.S.C. § 112(f) unless the words "means for" or "step for" are explicitly used in the particular element in question.

What is claimed is:

1. A module box cover including:
  a. a cover plate having:
    (1) opposing front and rear plate surfaces,
    (2) fasteners extending through the cover plate into an addressable input module:
      (a) situated adjacent the rear plate surface,
      (b) having a front face bearing an indicator lamp,
    (3) a lamp aperture aligned with the indicator lamp, whereby the indicator lamp is visible from the front plate surface,
  b. a sensor pocket having:
    (1) a pocket interior defined within pocket walls, the pocket walls including:
      (a) a pocket sidewall extending forwardly from the rear plate surface to
      (b) a pocket forewall spaced forwardly from the front plate surface, with
      (c) at least one port extending through the pocket walls,
    (2) a sensor within the pocket interior between the cover plate and the addressable input module, the sensor thereby being situated for connection to the addressable input module.

2. The module box cover of claim 1 wherein the cover plate has a rearwardly-extending lip bounding the rear plate surface.

3. The module box cover of claim 1 wherein the sensor pocket includes a depression:
  a. defined in the pocket sidewall adjacent the rear plate surface, and
  b. extending outwardly from the pocket interior.

4. The module box cover of claim 1 further including a rib extending between the cover plate and the pocket sidewall.

5. The module box cover of claim 1 further including a sensor enclosure having an enclosure sidewall extending forwardly from the front plate surface at locations spaced from the pocket sidewall to join the pocket wall at locations spaced from the front plate surface.

6. The module box cover of claim 5 further including a rib extending between the enclosure sidewall and the pocket sidewall.

7. The module box cover of claim 5 wherein the enclosure sidewall joins the pocket wall at the pocket sidewall rearwardly from the pocket forewall.

8. A module box cover including:
  a. a cover plate having:
    (1) opposing front and rear plate surfaces,
    (2) fasteners extending through the cover olate into an addressable input module:
      (a) situated adjacent the rear plate surface,
      (b) having a front face bearing an indicator lamp,
    (3) a lamp aperture aligned with the indicator lamp, whereby the indicator lamp is visible from the front plate surface,
  b. a sensor pocket having a pocket interior defined within pocket walls, the pocket walls including:
    (1) a pocket forewall:
      (a) spaced forwardly from the front plate surface, and
      (b) having a port extending therethrough,
    (2) a pocket sidewall:
      (a) extending rearwardly from the pocket forewall toward the rear plate surface, and
      (b) having a depression defined therein adjacent the rear plate surface, the depression extending outwardly from the pocket interior,
  c. a sensor within the pocket interior between the cover plate and the addressable input module, the sensor thereby being situated for connection to the addressable input module.

9. The module box cover of claim 8 further including one or more ribs extending between the pocket sidewall and the cover plate.

10. The module box cover of claim 8 wherein two or more of the depression are provided at locations spaced about the interior circumference of the sensor pocket.

11. The module box cover of claim 8 further including a sensor enclosure having:
  a. an enclosure wall extending from the front plate surface about the pocket sidewall, and
  b. ribs extending between the enclosure wall and the pocket sidewall.

12. The module box cover of claim 11 wherein the enclosure wall converges to join the pocket sidewall as the enclosure wall extends from the front plate surface.

13. The module box cover of claim 12 wherein the depression is situated within the sensor enclosure.

14. The module box cover of claim 8 further including a sensor enclosure:
  a. having an enclosure wall extending:
    (1) from the front plate surface at locations spaced from the pocket sidewall,
    (2) to join the pocket walls at locations spaced from the front plate surface,
  b. wherein the depression is situated within the sensor enclosure.

15. The module box cover of claim 14 further including a rib extending from the enclosure wall to the pocket sidewall.

16. A module box cover including:
  a. a cover plate having:
    (1) opposing front and rear plate surfaces,
    (2) a rearwardly-extending lip bounding the rear plate surface,
    (3) fasteners extending through the cover plate into an addressable input module:

(a) situated adjacent the rear plate surface, (b) having a front face bearing an indicator lamp, (4) a lamp aperture aligned with the indicator lamp, whereby the indicator lamp is visible from the front olate surface, b. a sensor pocket having a pocket interior defined within pocket walls, the pocket walls including:

(1) a pocket sidewall extending forwardly from the rear plate surface to a pocket forewall, (2) a port extending through the pocket forewall, the sensor pocket having a sensor within the pocket interior, the sensor being connected to the addressable input module, c. a sensor enclosure having an enclosure wall extending:

(1) forwardly from the front plate surface at locations spaced from the pocket sidewall, (2) to the pocket walls.

17. The module box cover of claim 16 further including ribs extending from the enclosure wall to the pocket sidewall.

18. The module box cover of claim 16 wherein the pocket sidewall includes spaced depressions defined therein:

a. adjacent the rear plate surface, and b. extending outwardly from the pocket interior.

19. The module box cover of claim 16 wherein the pocket forewall is situated forwardly from the enclosure walls.

* * * * *